United States Patent [19]
Fredrickson

[11] Patent Number: 5,945,837
[45] Date of Patent: Aug. 31, 1999

[54] INTERFACE STRUCTURE FOR AN INTEGRATED CIRCUIT DEVICE TESTER

[75] Inventor: Toby Alan Fredrickson, San Jose, Calif.

[73] Assignee: Xilinx, Inc., San Jose, Calif.

[21] Appl. No.: 08/811,817

[22] Filed: Mar. 4, 1997

Related U.S. Application Data

[63] Continuation-in-part of application No. 08/541,567, Oct. 10, 1995, Pat. No. 5,705,932.

[51] Int. Cl.$^6$ .................. G01R 1/02; G01R 1/04
[52] U.S. Cl. .................. 324/761; 324/755
[58] Field of Search .................. 324/725, 754, 324/755, 761; 439/482, 824, 91, 66, 86, 71, 591

[56] References Cited

U.S. PATENT DOCUMENTS

| | | | |
|---|---|---|---|
| 4,352,061 | 9/1982 | Matrone | 324/761 |
| 4,928,061 | 5/1990 | Dampier et al. | 324/754 |
| 4,975,638 | 12/1990 | Evans et al. | 324/72.5 |
| 5,015,946 | 5/1991 | Janko | 324/72.5 |
| 5,101,149 | 3/1992 | Adams et al. | 324/73.1 |
| 5,148,103 | 9/1992 | Pasiecznik, Jr. | 324/758 |
| 5,489,852 | 2/1996 | Gomez | 324/754 |
| 5,500,605 | 3/1996 | Chang | 324/761 |
| 5,600,259 | 2/1997 | Bartyzel et al. | 324/761 |
| 5,633,598 | 5/1997 | Van Loan et al. | 324/761 |

*Primary Examiner*—Vinh P. Nguyen
*Attorney, Agent, or Firm*—Edel M. Young; Patrick T. Bever

[57] ABSTRACT

An interface structure for providing connections between integrated circuit (IC) devices and a device tester. The interface structure includes a printed circuit board having one or more groups of pogo pins, each group being arranged to contact the pins extending from the pin grid array package of one IC device, and includes interconnect paths from the pogo pins and the device tester. The groups of pogo pins are mounted directly into the printed circuit board in a universal footprint arrangement that is customized to receive a plurality of different pin grid array package footprints. A nonconductive cover plate is mounted over the pogo pin groups upon which the IC devices are mounted by a handler. A mother board is connected between the printed circuit board and the device tester.

5 Claims, 11 Drawing Sheets

INTERFACE STRUCTURE FOR AN INTEGRATED CIRCUIT DEVICE TESTER

CROSS REFERENCE TO RELATED APPLICATION

This is a continuation in part of U.S. patent application Ser. No. 08/541,567 [docket X-160] filed by Toby Alan Fredrickson on Oct. 10, 1995, entitled "System Expanding Space Provided By Test Computer to Test Multiple Integrated Circuits Simultaneously" (now U.S. Pat. No. 5,705, 932), the content of which is incorporated herein by reference.

FIELD OF THE INVENTION

The present invention relates to an integrated circuit device tester, and more particularly to a interface structure for providing electrical connections between integrated circuit devices under test and the integrated circuit device tester.

BACKGROUND OF THE INVENTION

Integrated circuit (IC) devices typically include an IC chip which is housed in a plastic or ceramic "package". The IC chip is typically a piece of a thin wafer of silicon upon which an integrated circuit is formed. The package supports and protects the IC chip and provides electrical connections between the integrated circuit and an external circuit or system.

There are several package types, including ball grid arrays, pin grid array (PGAs), plastic leaded chip carriers, and plastic quad flat packs. Each of the package types is typically available in numerous sizes. The package type selected by an IC device manufacturer for a particular IC chip is typically determined by the size/complexity of the IC chip (i.e., the number of input/output terminals), and also in accordance with a customer's requirements.

Figure 1:
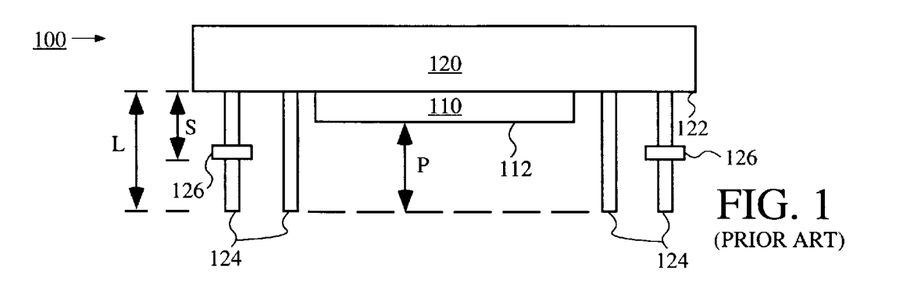
FIG. 1 is a side view of an integrated circuit mounted on a pin grid array package.

FIG. 1 shows a side view of an IC device 100 including an IC chip 110 mounted in a typical PGA package 120. IC chip 110 is mounted in a cavity formed in a lower surface 122 of package 120. Package 120 includes a plurality (four shown) of pins 124 which extend from lower surface 122 of the package body and are electrically connected to IC chip 110 using conductive lines (not shown). Pins 124 have a fixed length L which is measured from bottom surface 122. In addition, two or more of the pins 124 typically include a widened annular ("stand-off") portion 126 which maintains lower surface 122 at a fixed standoff distance S from a host PCB. A distance from a lower surface 112 of IC chip 110 to the tips of pins 124 is known as a projection distance P.

Figure 2A:
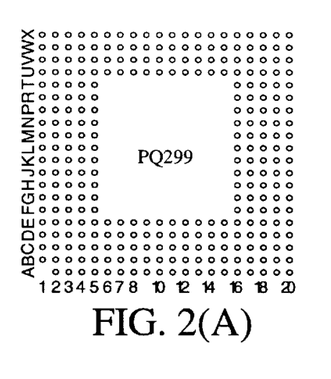
FIGS. 2(A) through 2(K) are diagrams showing the pin arrangements of several pin grid array packages.
Figure 2B:
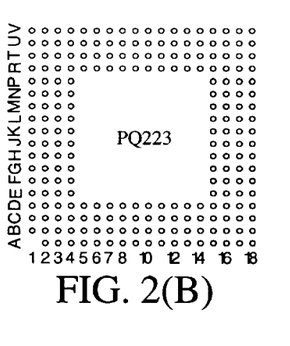
Figure 2C:
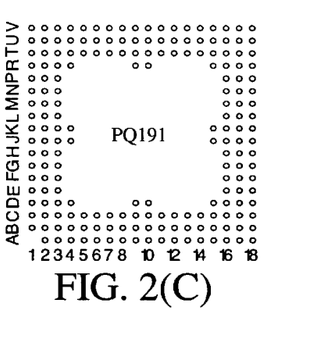
Figure 2D:
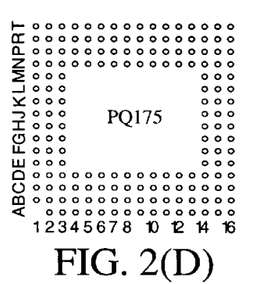
Figure 2E:
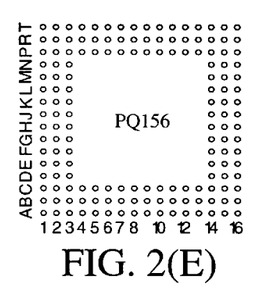
Figure 2F:
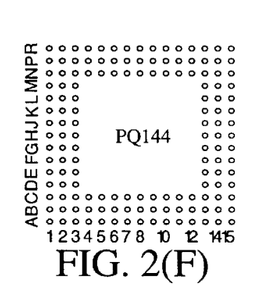
Figure 2G:
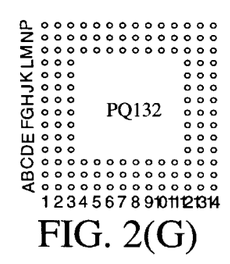
Figure 2H:
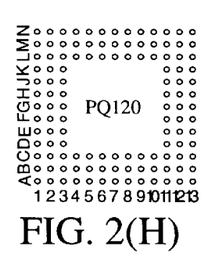
Figure 2I:
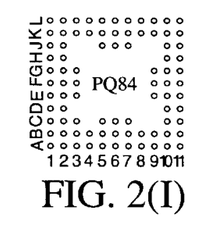
Figure 2J:
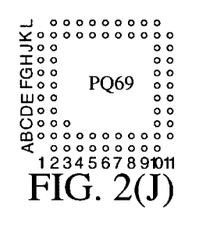
Figure 2K:
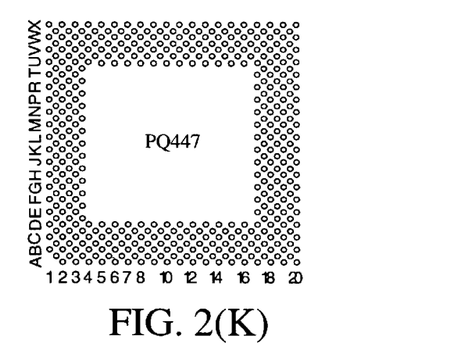

As with most package types, PGA packages are provided with a multitude of different package sizes, numbers of pins and pin arrangements (hereafter referred to as "footprints"). FIGS. 2(A) through 2(K) show the footprints of several PGA packages illustrating some of these variations. FIG. 2(A) shows a PG299 package which includes 299 pins formed in rows (1–20) and columns (A–X) around a central cavity which is provided for an IC chip. Likewise, FIGS. 2(B) through 2(J) show the footprints for PG223, PG191, PG175, PG156, PG144, PG132, PG120, PG84 and PG68 packages, respectively. Finally, FIG. 2(K) shows a high density PG447 package having 447 pins. FIGS. 2(A) through 2(K) illustrate footprints representing a set of PGA packages used by a single IC manufacturer to house its IC chips. In addition to the differences in footprints, the IC manufacturer must also provide different pin lengths L, standoff distances S and projection distances P of the pins associated with the various PGA packages, as discussed above with respect to FIG. 1.

IC device testing systems are used by IC manufacturers to test their IC devices before shipping to customers. IC device testing systems typically include a device tester, a device handler and an interface structure. A device tester is an expensive piece of computing equipment which transmits test signals via tester probes to the leads of an IC device, and processes signals received from the IC device. A device handler is an expensive precise robot for automatically moving IC devices from a storage area to the tester probes and back to the storage area. The interface structure is connected to the tester probes, and includes a test area (i.e., socket arrangement) for receiving IC devices from the device handler. When an IC device is mounted in the test area, electrical connections are made from the IC device through the sockets of the interface structure to the tester probes of the tester.

Device testers and device handlers are typically purchased by IC manufacturers from different companies. The choice of a particular device tester depends in part upon the number of pins associated with the IC manufacturer's IC devices. That is, the device tester must have a number of tester probes which is equal to or greater than the number of pins utilized by an IC device. Similarly, device handlers are selected based on, for example, the required throughput (i.e., the rate at which IC devices are to be tested).

Interface structures are often custom made for or produced by an IC device manufacturer to interface between a particular device tester and a particular IC device produced by the manufacturer. Each interface structure must be built to contact the tester probes of the device tester, and to provide a test area having an arrangement of contacts which matches the footprint of the IC device to be tested.

Figure 3:
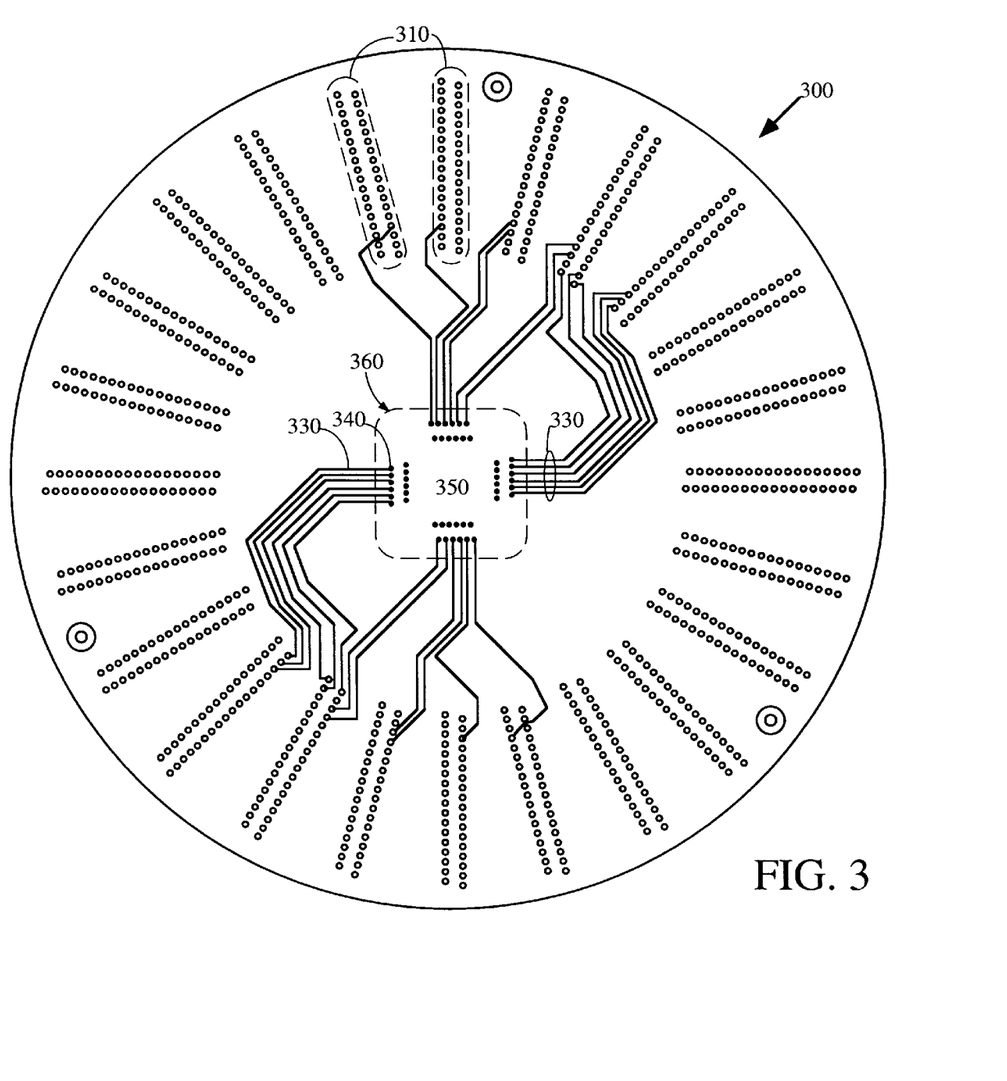
FIG. 3 is a top view of an interface structure having a larger test area.

FIG. 3 shows a top view of an interface structure 300 described by the present inventor in commonly-assigned patent application 08/541,567 [Docket X-160] which is used to test IC devices housed in PGA packages. Interface structure 300 includes vias 310 arranged in groups which are spaced around the perimeter of a disk-shaped printed circuit board (PCB) 320 and extend toward the center of PCB 320. The arrangement of vias 310 shown in FIG. 3 represents that which must be used with the SC212 tester from Credence Systems Corporation. Vias 310 are mounted onto and receive male tester probes extending from the device tester (not shown). Several (48) vias 310 are connected by metal traces 330 to sockets 340 of a centrally-located test area 350. An IC device 360 (indicated by dashed lines) is mounted in the test area 350 such that the pin terminals (not shown) which extend from the PGA package of the IC device 360 are received in the sockets 340. After IC device 360 is mounted, the test device transmits test signals through the male tester probes (not shown) to the vias 310, and along traces 330 to the pin terminals of IC device 360. Similarly, return signals from IC device 360 are transmitted to the test device through sockets 340, traces 330 and vias 310.

A problem with the interface structure 300 is that it makes inefficient use of the device tester (not shown) to which the interface structure 300 is mounted because the space provided for the test area 350 is too small to handle multiple IC devices. Assume that an IC manufacturer has two IC devices having 96 pins and 48 pins, respectively. The IC manufacturer must purchase a tester having 96 tester probes to test the IC device having 96 pins, and may also use the tester to test the IC device having 48 pins. Interface structure 300 may be used to test the 48-pin IC device. However, during each test iteration of the 48-pin IC device, many of the tester probes of the tester are not in use, thereby making inefficient use of the tester.

Figure 4:
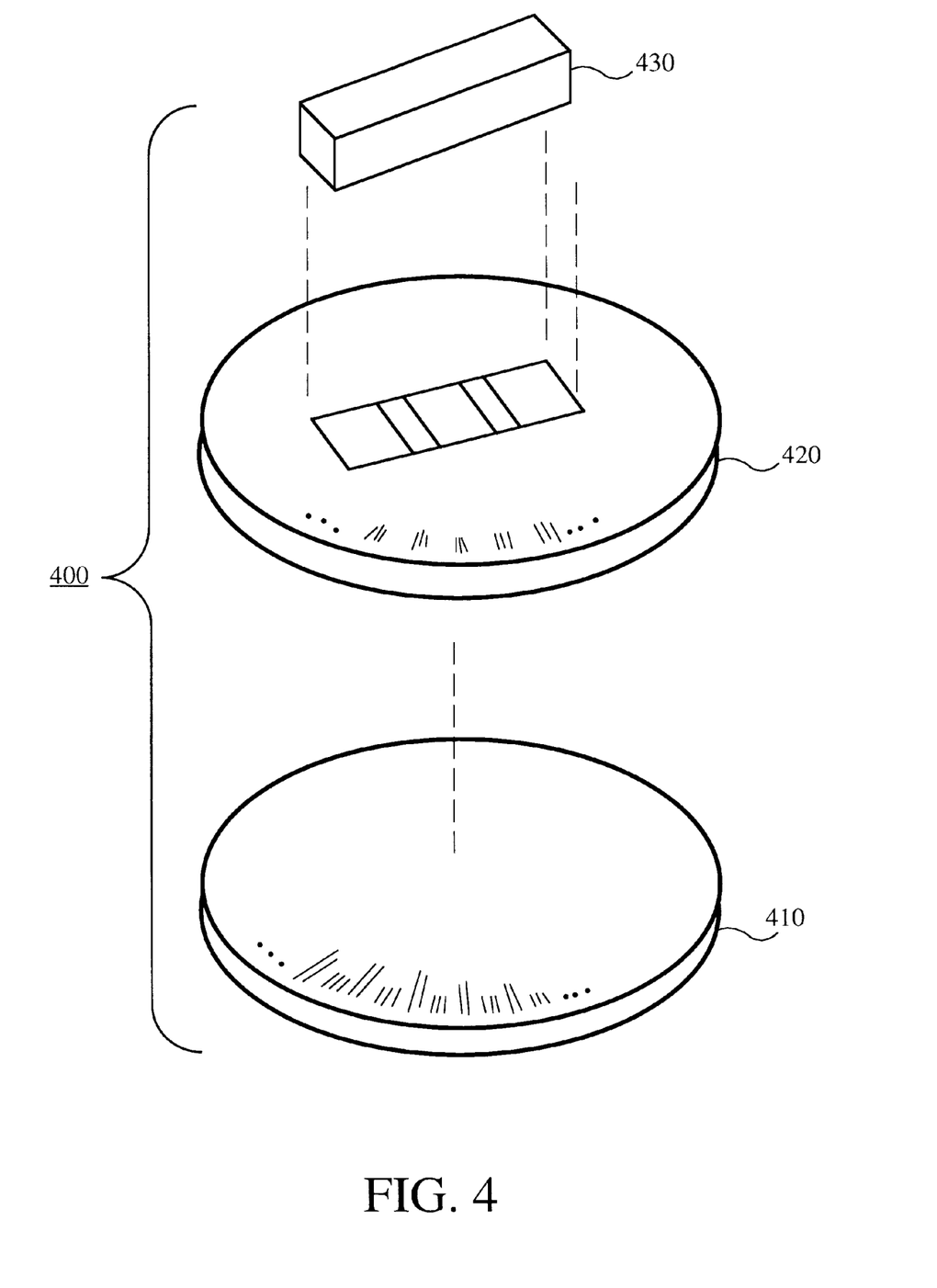
FIG. 4 is an exploded view of a second interface structure.

FIG. 4 shows an exploded perspective view of a second interface structure 400 which includes a disk-shaped mother board 410, a disk-shaped daughter board 420 and a contactor 430. The second interface structure is designed to overcome the limitations of the interface structure 300 (see FIG. 3) by expanding the test area, thereby permitting a tester to test multiple IC devices at the same time, while minimizing any signal loss, and without necessitating any change in the spacing and location of the groups of tester probes in order to be compatible with standard automatic test equipment (ATE) testers.

Figure 5:
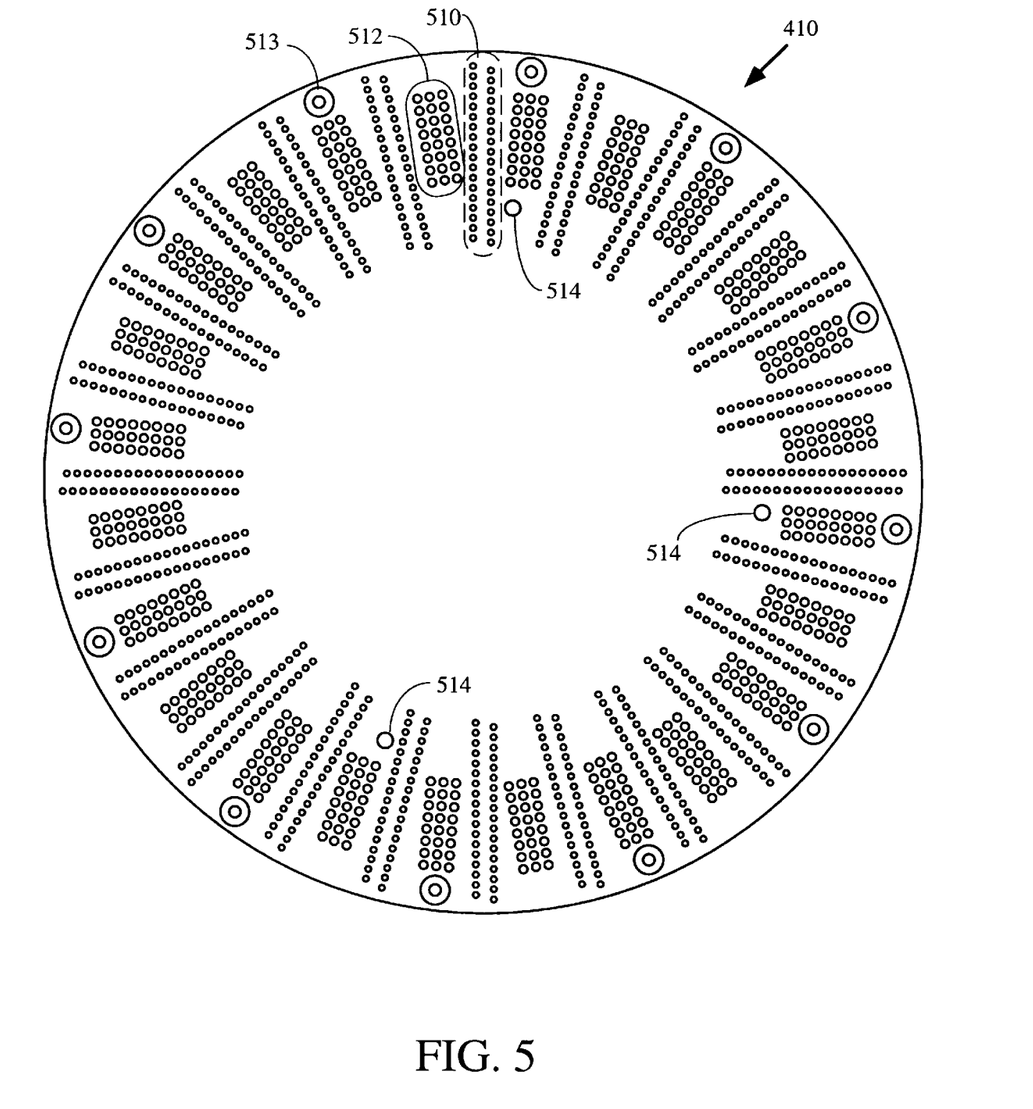
FIG. 5 is a top view of a mother board of the interface structure shown in FIG. 4.

FIG. 5 shows the top surface of mother board 410. Similar to the interface structure 300 (FIG. 3), mother board 410 includes vias 510 which are formed into groups and which extend to the bottom surface of board 410 and make contact with correspondingly placed male probes of a tester. The configuration of vias 510 shown in FIG. 5 represents the arrangement which must be used with the SC212 tester from Credence Systems Corporation. Compressible probes ("pogo pins") 512 are arranged in groups between adjacent groups of vias 510 and extend upward from the top surface of mother board 410. The pogo pins 512 are connected through metallization (not shown) to corresponding vias 510. Reinforced apertures 513 are provided around the perimeter of mother board 410, and adjacent to pogo pin groups 512 for receiving a shoulder bolt connected through the daughter board 420 (as discussed below). Guide pins 514 are positioned asymmetrically in mother board 410 and extend upward from mother board 410.

Figure 6:
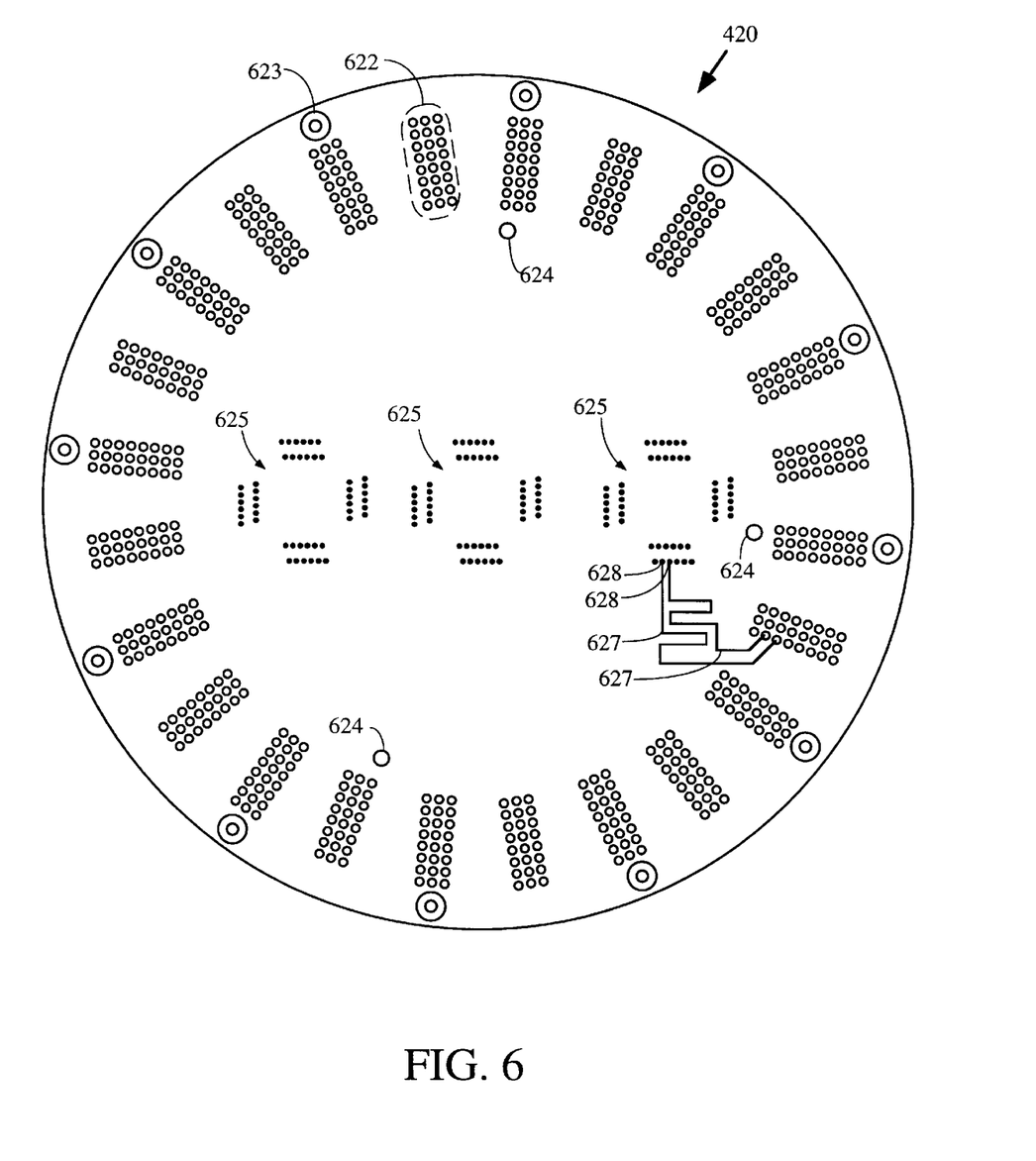
FIG. 6 is a top view of a handler board of the interface structure shown in FIG. 4.

FIG. 6 shows a top surface of daughter board 420 which can be used with mother board 410. Daughter board 420 includes contact pads (contacts) 622 arranged in groups for contacting corresponding pogo pins 512 on mother board 410. Reinforced apertures 623 receive the shoulder bolts which connect daughter board 420 to mother board 410. When the shoulder bolts are tightened, contacts 622 press against pogo pins 512. Guide apertures 624 receive guide pins 514 from mother board 410 and assure proper alignment of all pogo pins to corresponding contacts. Three groups 625 of pogo pin receptacles 628 are arranged in the central portion of daughter board 420. Metallization lines 627 illustrate connections between contacts 622 and pogo pin receptacles 628.

Figure 7:
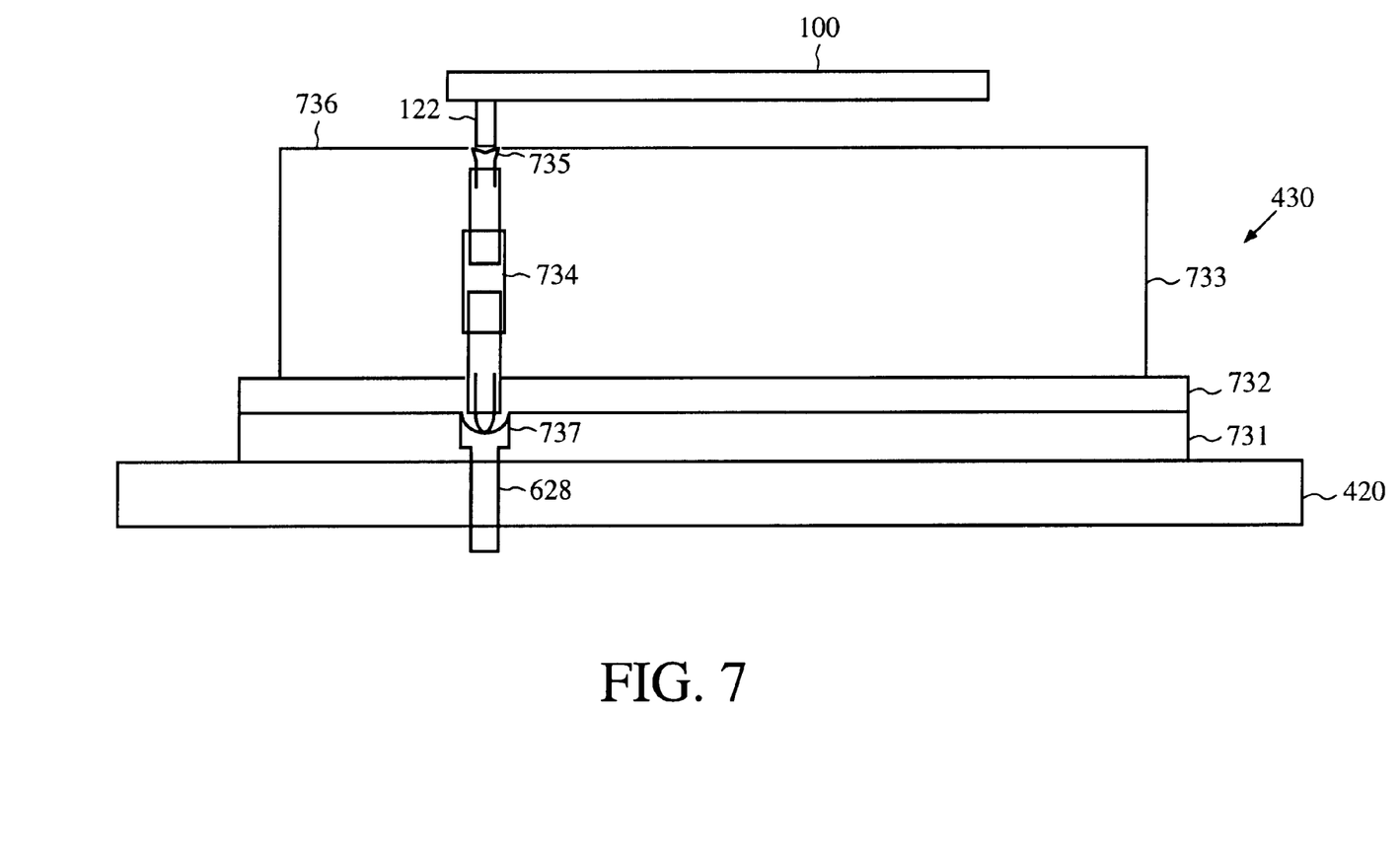
FIG. 7 is a cross sectional side view showing a connection between the contactor and daughter board of the interface structure show in FIG. 4.

FIG. 7 shows a cross section side view of a portion of contactor 430 mounted on daughter board 420. Contactor 430 includes a vespel purge plate 731 (vespel is an extremely hard, non-conductive, anti-static plastic having a thermal expansion coefficient similar to aluminum and able to tolerate a wide temperature range) which rests on the upper surface of the daughter board 420, a metal contactor base 732 mounted on the purge plate 731, and a metal contactor body 733 mounted on the contactor base 732. The contactor body 733 incorporates a plurality of dual spring-probe pogo pins 734, each pogo pin 734 having an upper tip 735 exposed through an upper surface 736 of contactor body 733, and a lower tip 737 extending through the contactor base 732 and vespel purge plate 731 to contact a pogo pin receptacle 628 on daughter board 420. When a handler device mounts an IC device 100 onto the contactor 430, each pin 124 of IC device 100 contacts the upper tip 735 of one of the pogo pins 734. Test signals are thereby transmitted to and from the IC device 100 through the pogo pins 734 to the pogo pin receptacles 628, along the metallization lines 627 to the contacts 622 (FIG. 6), through the pogo pins 512 to the vias 510 (FIG. 5), and from the vias 510 to the tester probes of the tester (not shown).

The interface structure 400 is a significant improvement over the interface structure 300 in that it provides an expanded work area which allows simultaneous testing of two or more IC devices, thereby making more efficient use of a device tester.

Although interface structure 400 is a significant improvement over interface structure 300, several problems have arisen regarding interface structure 400.

First, electrical contacts between contactor 430 and daughter board 420 are often damaged or contaminated, thereby introducing production delays or undesirable resistances which produce erroneous test results. The purpose for contactor 430 is to protect both the IC device being tested and daughter board 420 during mounting by a device handler. For this reason, contactors 430 are designed as expendable parts which are subject to damage when, for example, a handler improperly presses an IC device against a contactor 430 with excessive force. When this occurs, the pogo pins 734 can be damaged, thereby requiring expensive interruptions in the testing process. Further, prolonged use of the contactors typically results in tin-lead contamination at the contact points between at the IC devices and the upper tips 735 of the pogo pins 734, and between the lower tips 737 of pogo pins 734 and the pogo pin receptacles 628 of daughter board 420, thereby introducing resistances which generate erroneous test results.

Second, although one mother board 410 may be produced for each device tester, each IC device requires a separate daughter board 420 and contactor 430. That is, although mother board 410 is universal to all IC devices tested on a particular device tester, daughter boards 420 and contactors 430 are produced specifically for each IC device. This requires an IC manufacturer to purchase or produce at least one daughter board 420 and contactor 430, which cost thousands of dollars each, for each type of IC device produced by the manufacturer. This limits the IC manufacturer's ability to stock replacement daughter boards and contactors, thereby causing production delays when the daughter board and/or contactor for a particular IC device fails during testing.

SUMMARY OF THE INVENTION

In addition to increasing the size of the test area, an interface structure for testing IC devices incorporates compressible probes directly into a daughter board, thereby reducing the cost of producing and maintaining test equipment. In order to protect the daughter board from damage, a cover plate is provided over the daughter board which prevents the IC device from being pressed by the device handler beyond the operating stroke of the compressible probes. An upper surface of the cover plate is formed with a series of openings through which the pins of an IC device contact the compressible probes. The downward movement of the IC device is limited by contact between the pin stand-off portions and the upper surface of the cover plate.

In accordance with a second aspect of the present invention, an interface structure for testing IC devices is provided in which compressible probes are arranged in a universal footprint pattern which allows testing of multiple IC devices using a single daughter board, thereby greatly reducing the cost of maintaining and operating a test apparatus. The daughter board includes a plurality of stock, low cost compressible probes fixedly mounted such that a barrel (body) of each compressible probe extends into the printed circuit board. The compressible probes are arranged in a universal footprint pattern which allows testing of IC devices housed in two or more PGA packages having different footprints. The cover plate is mounted on the surface of the printed circuit board structure and includes holes through which tips (crowns) of the compressible probes are exposed. When an IC device is mounted on the cover plate, the pins of the IC device extend into the holes and contact the crowns of the compressible probes.

BRIEF DESCRIPTION OF THE DRAWINGS

FIGS. 12(A), 12(B), 12(C) and 12(D) are explanatory diagrams, where FIGS. 12(A), 12(B) and 12(C) are bottom views of various PGA devices.

DETAILED DESCRIPTION OF THE DRAWINGS

Figure 8:
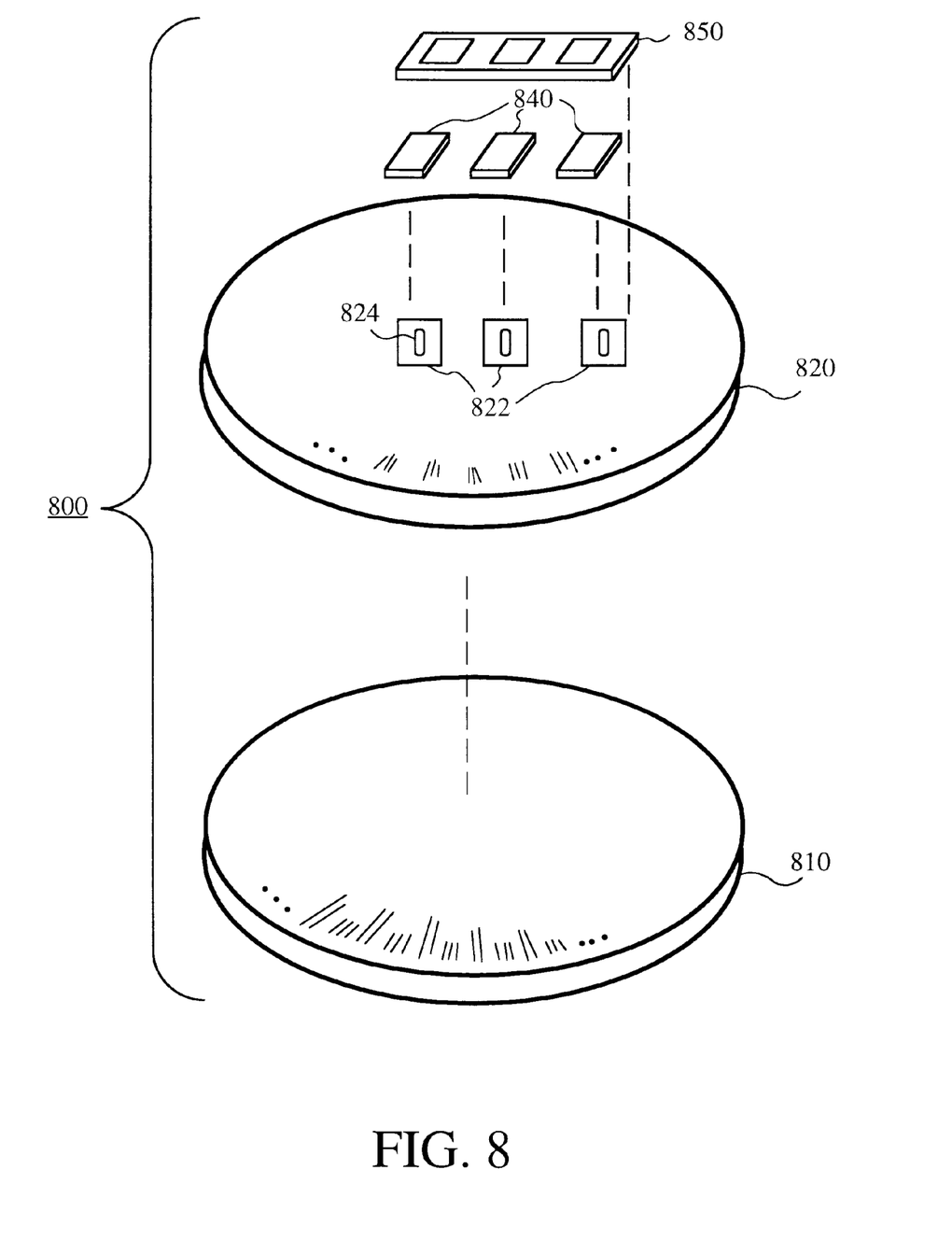
FIG. 8 is an exploded view of an interface structure in accordance with the present invention.

FIG. 8 shows an exploded view of an interface structure 800 in accordance with an embodiment of the present invention. Interface structure 800 includes both a mother board 810 and a daughter board 820, although mother board 810 may be omitted in some embodiments of the present invention. Mother board 810 mounts onto the tester probes of a device tester (not shown). Daughter board 820 mounts on mother board 810 and includes one or more test areas 822 (three shown), each test area 822 including a plurality of compressible probes (pogo pins) 824. Interface structure 800 also includes one or more cover plates 840 (three shown) which are fixedly mounted over test areas 822 and are secured to daughter board 820 by a frame 850. When an integrated circuit (IC) device (not shown) is mounted by a device handler (not shown) onto cover plate 840, each pin of the IC device extends through an opening formed in an upper surface of cover plate 840 and contacts a selected compressible probe 824 of one test area 822.

Figure 9A:
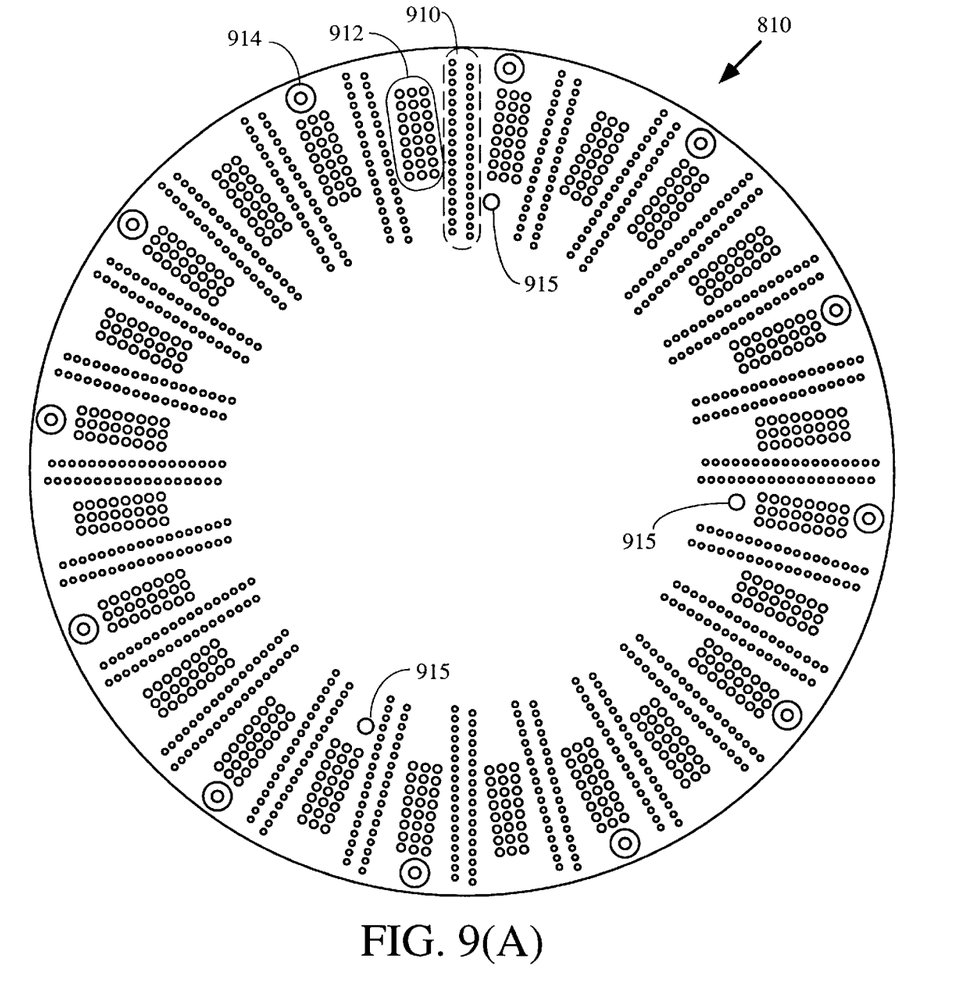
FIGS. 9(A) and 9(B) are top and cross sectional side views of a mother board of the interface structure shown in FIG. 8.
Figure 9B:
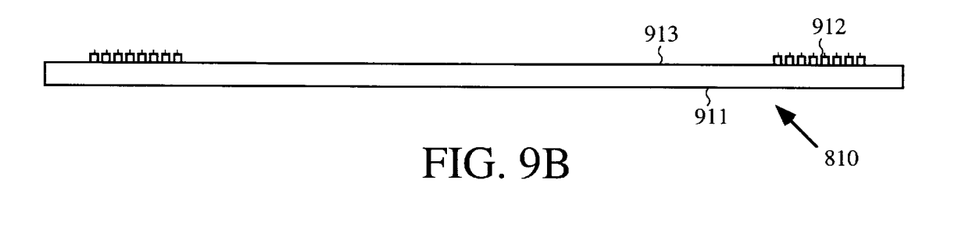

FIGS. 9(A) and 9(B) are top and cross sectional side views of mother board 810 which is essentially identical to mother board 410 of interface structure 400. The purpose of mother board 810 is to expand the available work area which permits simultaneous testing of two or more IC devices, thereby making more efficient use of a device tester. However, if the tester probes of a device tester are arranged to provide a sufficient work area, mother board 810 may be omitted, and daughter board 820 mounted directly onto the tester probes of the device tester.

Referring to FIGS. 9(A) and 9(B), mother board 810 of the disclosed embodiment includes vias 910 which are formed into groups and which extend to a bottom surface 911 of mother board 810 and make contact with correspondingly positioned male probes of a device tester. Vias 910 are arranged in a manner necessary to interface with the SC212 tester from Credence Systems Corporation. Of course, other device testers would require different arrangements of vias 910. Compressible probes ("pogo pins") 912, each having a single spring-probe, are arranged in groups between adjacent groups of vias 910 and extend upward from a top surface 913 of mother board 810, as shown in FIG. 9(B). The pogo pins 912 are connected through metallization (not shown) to corresponding vias 910. Preferably, all metallization lines which connect a tester probe to a pogo pin 912 are laid out to produce the same signal delay. Reinforced apertures 914 are provided around the perimeter of mother board 810, and adjacent to pogo pins 912 for receiving a shoulder bolt connected through daughter board 820 (as discussed below). Guide pins 915 are positioned asymmetrically in mother board 810 and extend upward from mother board 810.

Figure 10A:
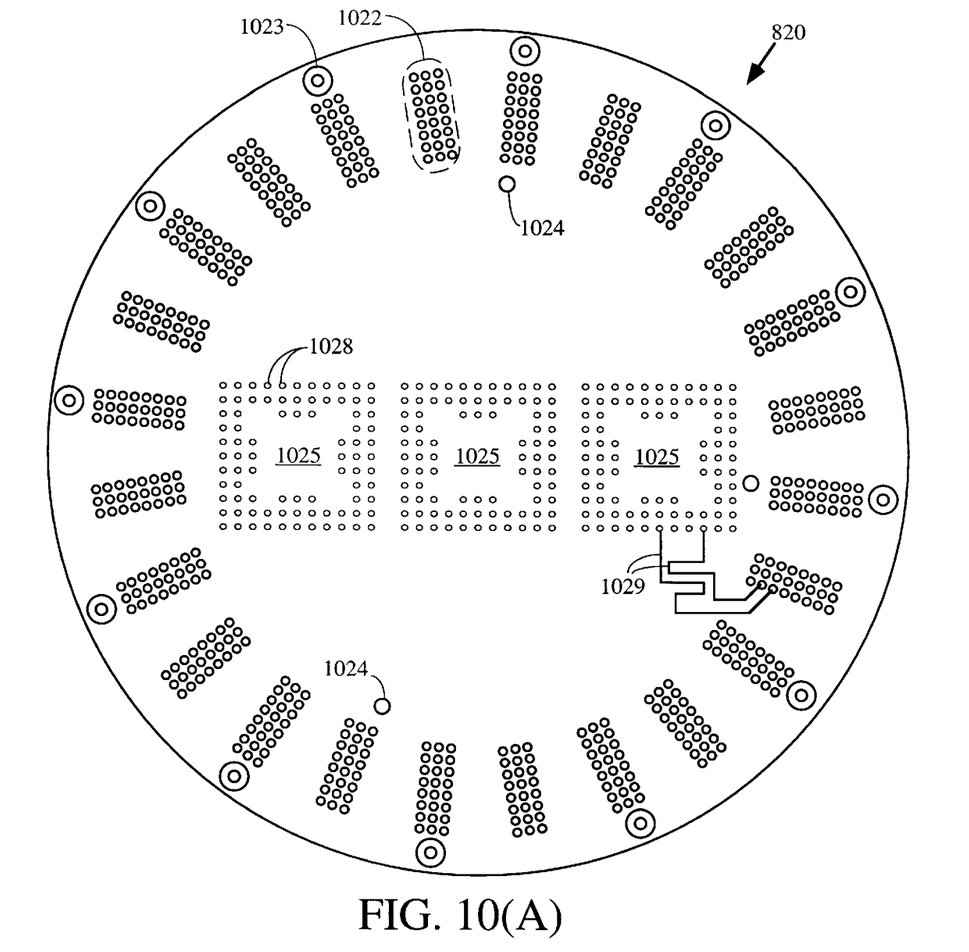
FIGS. 10(A) and 10(B) are top and cross sectional side views of a daughter board of the interface structure shown in FIG. 8.
Figure 10B:
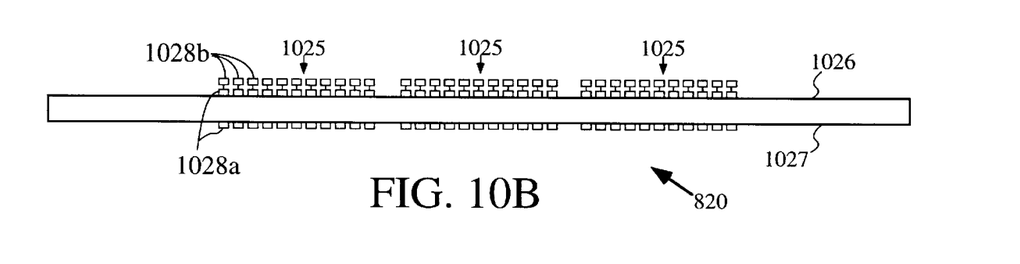

FIGS. 10(A) and 10(B) are top and cross sectional side views of daughter board 820.

FIG. 10(A) shows a top surface of daughter board 820 which includes contact pads (contacts) 1022 arranged in groups for contacting corresponding pogo pins 912 on mother board 810. Reinforced apertures 1023 receive the shoulder bolts which connect daughter board 820 to mother board 810. When the shoulder bolts are tightened, contacts 1022 press against pogo pins 912. Guide apertures 1024 receive guide pins 915 from mother board 810 and assure proper alignment of all pogo pins to corresponding contacts.

Three test areas 1025 are provided on daughter board 820. In accordance with a first aspect of the present invention, each test area 1025 includes a plurality of single-ended compressible probes (pogo pins) 1028 which are mounted directly into inserts formed in daughter board 820. Suitable pogo pins 1028 are produced by Ingun of Konstanz, Germany, have a crown-type tip and have a stroke of 100 mils or more. As shown in FIG. 10(B), each pogo pin 1028 includes a barrel (body) 1028a which is received into holes formed in daughter board 820 such that a portion of each barrel 1028a extends from an upper surface 1026 and a bottom surface 1027 of daughter board 820. In addition, each pogo pin 1028 includes a tip (crown) 1028b which is movable relative to the barrel 1028a and extends above the upper surface 1026 of daughter board 820. Pogo pins 1028 are rigidly held and are electrically connected to contacts 1022 by metallization lines (conductive paths) 1029. Preferably, all metallization lines are laid out to produce a common signal delay.

Figure 11A:
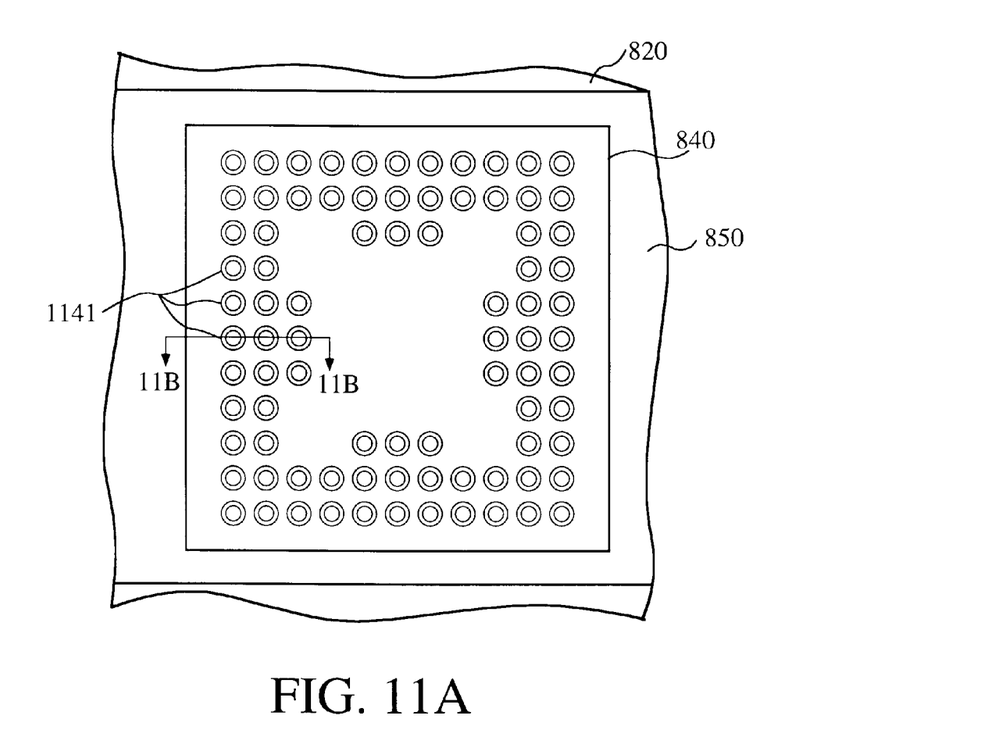
FIGS. 11(A) and 11(B) are top and cross sectional side views of a cover plate of the interface structure shown in FIG. 8.
Figure 11B:
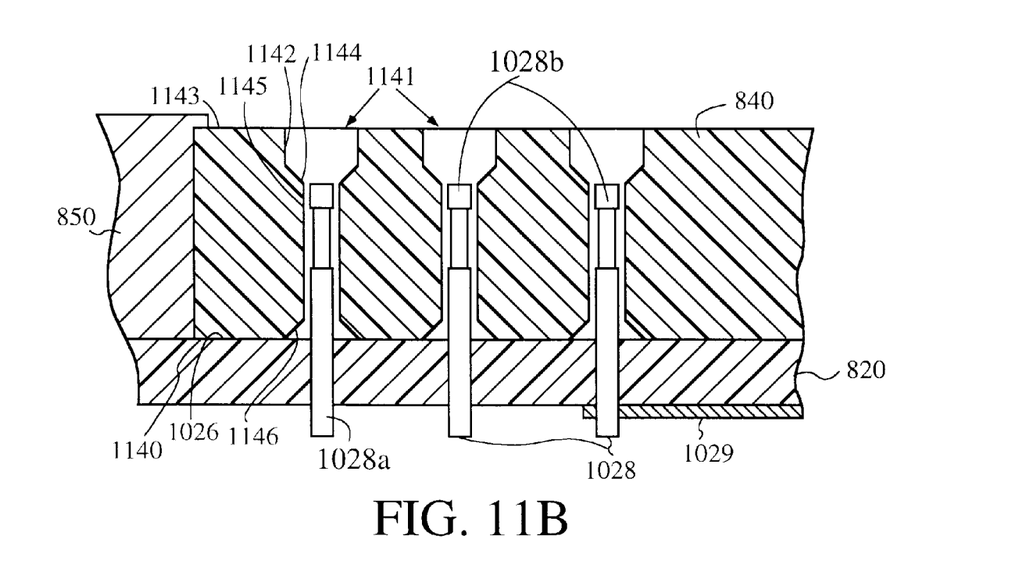

FIGS. 11(A) and 11(B) are top and cross sectional side views of a simplified cover plate 840 which is preferably machined from a block of vespel, but can be formed using G10 or another material having similar wear and thermal expansion characteristics. Cover plate 840 includes a lower surface 1140 which rests on upper surface 1026 of daughter board 820, and includes a plurality of openings 1141 arranged in a pattern which matches the arrangement of pogo pins 1028 associated with one test area 1025 of daughter board 820. When cover plate 840 is mounted on daughter board 820, each pogo pin 1028 is received into one opening 1141. Each opening 1141 includes a counterbore area 1142 located adjacent upper surface 1143 of cover plate 840, a first countersink area 1144 located immediately below counterbore area 1142, and a main shaft area 1145 extending from first countersink area 1144 to a second countersink area 1146, which is located adjacent lower surface 1140 of cover plate 840. First countersink area 1144 is provided to facilitate insertion of the pins of an IC device by guiding a tip of each pin into the main shaft area 1145. Once the pins of the IC device enter the main shaft area 1145, the stand-off portions 126 (see FIG. 1) of the IC device enter the counterbore area 1142. Counterbore area 1142 is provided in every hole on cover plate 840, and is formed with a diameter (e.g., 2.75 mm) which is slightly larger than an anticipated maximum diameter of the stand-off portion 126 (see FIG. 1). In a resting (uncompressed) state, the crown 1028b of each pogo pin 1028 is preferably positioned in the main shaft area 1145 and slightly below the first countersink area 1144. When the stand-off portion enters the counterbore area 1142, the tips of the pins press the crowns 1028b of the pogo pins 1028 downward, thereby compressing the pogo pins 1028. Ideally, each pogo pin 1028 is positioned such that the crown 1028b is compressed 50 to 70% of the total pogo pin stroke length (i.e., 50 to 70 mils) when the pins of the IC device are fully inserted into the main shaft areas 1145. This prevents poor readings caused by inadequate contact between the pins 124 and crowns 1028b, and also prevents the tips of pins 124 from being inserted deeper into openings 1141 than a stroke length of pogo pins 1028, thereby preventing damage to pogo pins 1028. Each main shaft area 1145 has a diameter which does not exceed 1.5 times the widest diameter of crowns 1028b in order to prevent wedging of the IC device pins between the crown 1028b and a wall of the main shaft area 1145. Second countersink areas 1146 facilitate mounting of cover plate 840 by guiding crowns 1028b into main shaft areas 1145 when cover plate 840 is lowered onto daughter board 820.

Frame 850 is mounted to daughter board 820 using, for example, bolts (not shown). Frame 850 is formed, for example, from aluminum and serves to hold cover plate 840 against daughter board 820.

By incorporating pogo pins 1028 directly into daughter board 820 and by using cover plate 840 to protect the tips of pogo pins 1028, the need for a separate contactor is eliminated, thereby reducing the overall cost of the interface structure. Further, because the contactor is eliminated, erroneous test results obtained from damaged contactor connections are eliminated, thereby reducing testing delays caused by troubleshooting the test equipment to located damaged parts.

Also, the number of contact points between an IC device under test and the device tester is reduced. Unlike the interface structure 400, the interface structure of FIG. 8 provides direct connection between the IC device under test and the daughter board, which transmits signals from pogo pins 1028 via metallization lines 1029 (see FIG. 11(B)) to the contacts 1022. This reduces the number of possible points at which contaminants may create high resistances which impede test signals transmitted between the IC device and the tester.

In accordance with the second aspect of the present invention, pogo pins 1028 of each test area 1025 are arranged in a universal footprint arrangement which facilitates the use of a single daughter board to test IC devices having multiple footprints.

Figure 12A:
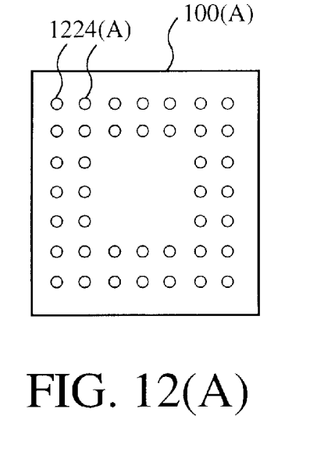
Figure 12B:
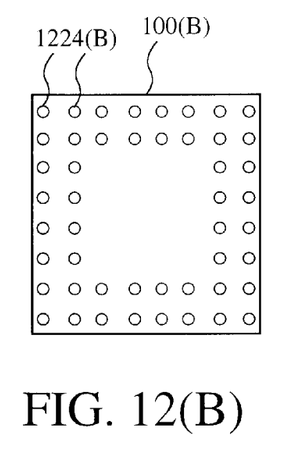
Figure 12C:
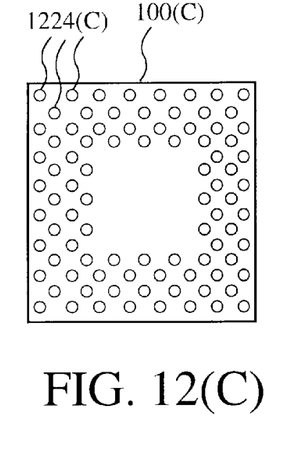

The definition of "universal footprint" is explained with the aid of FIGS. 12(A) through 12(D). FIGS. 12(A), 12(B) and 12(C) are bottom views of IC devices 100(A), 100(B) and 100(C), respectively, which have distinct footprints. Specifically, IC device 100(A) includes pins 1224(A) arranged in a seven-by-seven matrix with a center area provided for an IC chip, IC device 100(B) includes pins 1224(B) arranged in an eight-by-eight matrix, and IC device 100(C) includes pins 1224(C) arranged in a high density arrangement which combines the seven-by-seven and eight-by-eight matrices of IC devices 100(A) and 100(B).

Figure 12D:
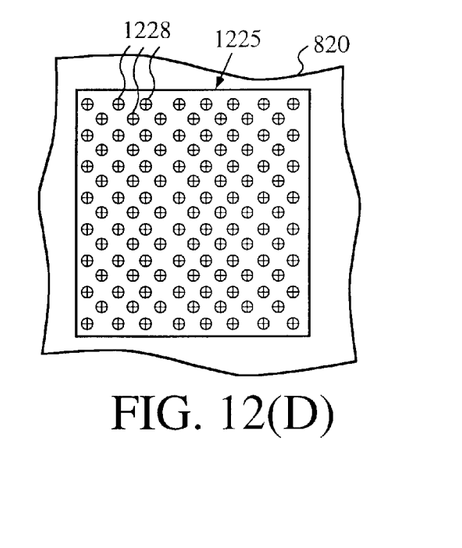
FIG. 12(D) is top view showing an universal footprint for testing IC devices having the footprints shown in FIGS. 12(A) through 12(C).

FIG. 12(D) shows a top view of a test area 1225 formed on daughter board 820 including pogo pins 1228. In accordance with the second aspect of the present invention, pogo pins 1228 are arranged in a "universal footprint" arrangement such that when any of IC devices 100(A), 100(B) or 100(C) are mounted thereon, each pin 1224(A), 1224(B) or 1224(C) contacts one of pogo pins 1228. By forming universal footprints onto each daughter board 820, the number of daughter boards 820 required by an IC manufacturer may be greatly reduced, thereby reducing the cost of producing and maintaining test equipment for IC devices housed in multiple PGA packages. For example, a daughter board 820 may be formed with pogo pins arranged in a universal footprint pattern suitable for testing IC devices housed in PGA packages having any of the footprints illustrated in FIGS. 2(A) through 2(K). Further, because a universal footprint pattern is common for multiple footprints, the daughter boards can be mass produced, thereby avoiding high custom production costs. Of course, the test signals generated by the device tester are altered for each IC device footprint such that test signals are transmitted to and received from appropriate pogo pins of each IC device.

The above description of embodiments of this invention is intended to be illustrative and not limiting. For example, in some microwave applications the portion of pogo pins 1028 extending below the lower surface of daughter board 820 may act as an antenna, thereby affecting the testing process. In these instances custom pogo pins may be used which utilize a shorter barrel. Other embodiments of this invention will be obvious to those skilled in the art in view of the above disclosure.

I claim:

1. An interface structure for connecting an integrated circuit device to an integrated circuit device tester, the integrated circuit device including a plurality of pins extending from a surface thereof, the interface structure comprising:

a printed circuit board having opposing first and second sides;

a plurality of first contacts mounted on the first side of the printed circuit board;

a plurality of compressible probes fixedly connected to the printed circuit board such that each of the compressible probes includes a body embedded into the printed circuit board and a tip movably connected to the body and extending from the second side of the printed circuit board;

a plurality of conductive paths formed on the printed circuit board, each conductive path connecting one of said first contacts to one of said compressible probes; and a cover plate having a plurality of openings formed in a first surface thereof, the cover plate being mounted onto the second side of the printed circuit board such that the tip of one of the compressible probes is aligned with one of the openings;

wherein when the integrated circuit device is mounted on the first surface of the cover plate, each pin of integrated circuit device extends through one of plurality of openings and contacts the tip of one of plurality of compressible probes.

2. The interface structure according to claim 1, wherein the cover plate is formed from vespel.

3. The interface structure according to claim 1, wherein the interface structure further comprises:

a mother board for transmitting signals between the first contacts of the printed circuit board and the device tester, the mother board including:

a second printed circuit board having opposing first and second sides;

a plurality of vias formed in the printed circuit board;

a plurality of second compressible probes, each of the second compressible probes having a tip extending from the first side of the second printed circuit board for contacting an associated one of the plurality of first contacts;

wherein test signals are transmitted from the device tester through the vias and the plurality of second compressible probes to the plurality of first contacts.

4. An interface structure for connecting either of a first integrated circuit device and a second integrated circuit device to an integrated circuit device tester, the first integrated circuit device including a first pin grid array package having a first footprint, the second integrated circuit including a second pin grid array package having a second footprint which is different from the first footprint, the interface structure comprising:

a printed circuit board having opposing first and second sides;

a plurality of first contacts mounted on the first side of the printed circuit board;

a plurality of compressible probes mounted on the printed circuit board, each of the compressible probes includes a body and a tip movably connected to the body, the plurality of compressible probes being arranged in a universal footprint pattern such that when the first integrated circuit device is mounted on the printed circuit board, the pins of the first integrated circuit contact a first set of the compressible probes, and when the second integrated circuit device is mounted on the printed circuit board, the pins of the second integrated circuit contact a second set of the compressible probes, the first set being different from the second set;

a plurality of conductive paths formed on the printed circuit board, each conductive path connecting one of said first contacts to one of said compressible probes; and a cover plate having a plurality of openings formed in a first surface thereof, the cover plate being mounted onto the second side of the printed circuit board such that the tip of one of the compressible probes is aligned with one of the openings.

5. The interface structure according to claim 4, wherein the interface structure further comprises:

a mother board for transmitting signals between the first contacts of the printed circuit board and the device tester, the mother board including:

a second printed circuit board having opposing first and second sides;

a plurality of vias formed in the printed circuit board;

a plurality of second compressible probes, each of the second compressible probes having a tip extending from the first side of the second printed circuit board and contacting an associated on of the plurality of first contacts;

wherein test signals are transmitted from the device tester through the vias and the plurality of second compressible probes to the plurality of first contacts.

* * * * *